United States Patent

Fukuda

[11] Patent Number: 5,309,429
[45] Date of Patent: May 3, 1994

[54] TRANSMITTER-RECEIVER

[75] Inventor: Kunio Fukuda, Tokyo, Japan

[73] Assignee: Sony Corporation, Tokyo, Japan

[21] Appl. No.: 839,607

[22] Filed: Feb. 21, 1992

[30] Foreign Application Priority Data

Feb. 22, 1991 [JP] Japan .................................. 3-050477
Feb. 22, 1991 [JP] Japan .................................. 3-050478

[51] Int. Cl.⁵ .............................................. H04B 1/56
[52] U.S. Cl. ........................................ 370/29; 455/86; 455/257
[58] Field of Search ............... 370/24, 29, 30; 455/71, 455/84, 86, 87, 257, 259, 260, 265

[56] References Cited

U.S. PATENT DOCUMENTS

| | | | |
|---|---|---|---|
| 3,916,412 | 10/1975 | Amoroso, Jr. | 455/86 |
| 4,325,140 | 4/1982 | Stitzer | 455/86 |
| 4,903,257 | 2/1990 | Takada et al. | 370/29 |
| 5,123,008 | 6/1992 | Beesley | 370/29 |

FOREIGN PATENT DOCUMENTS

| | | |
|---|---|---|
| 0253680 | 2/1988 | European Pat. Off. |
| 3626792 | 2/1988 | Fed. Rep. of Germany |
| 2199708 | 7/1988 | United Kingdom |
| 2222040 | 2/1990 | United Kingdom |

*Primary Examiner*—Benedict V. Safourek
*Attorney, Agent, or Firm*—Robert P. Biddle; Jerry A. Miller

[57] ABSTRACT

A TDD type transmitter-receiver capable of dividing one channel into a transmission slot and a reception slot with respect to time and performing time-divided transmission and reception of data during such slots respectively. The transmitter-receiver includes a transmitting circuit having the capacity to generate a carrier signal; a receiving circuit having an oscillator to generate an oscillation signal for converting a received signal into a predetermined intermediate frequency signal, and a mixer to mix the received signal with the oscillation signal; a signal line for supplying a leakage signal in the transmitting circuit to the receiving circuit; a frequency discriminator for converting into a voltage the frequency of the intermediate frequency signal obtained from the receiving circuit; a device for storing the voltage therein; and circuitry for controlling the oscillation frequency of the oscillator in accordance with the voltage. Since the frequency oscillation is controlled in conformity with the reference voltage, an exact AFC action can be executed under any environmental conditions.

19 Claims, 5 Drawing Sheets

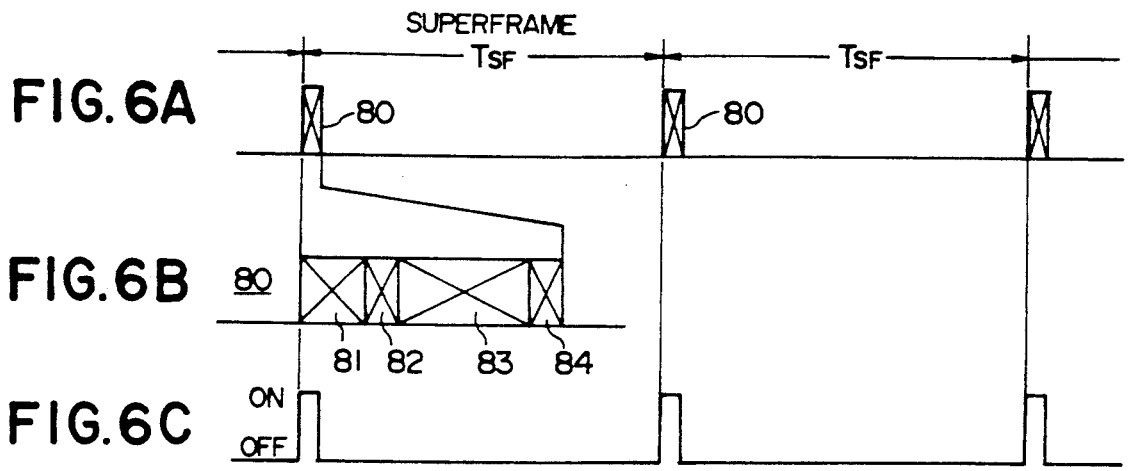
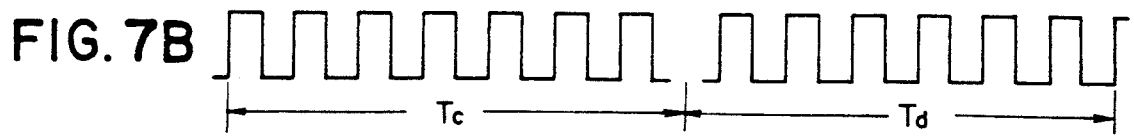

TRANSMITTER-RECEIVER

BACKGROUND OF THE INVENTION

1. Field of the Invention

The present invention relates to a TDD type transmitter-receiver for use in both home and public cordless telephone systems

2. Description of the Prior Art

In a digital cordless telephone system such as a telepoint system, there is generally employed a TDD or TDMA/TDD method which executes ping-pong transfer of signals by using one frequency for both transmission and reception.

According to the TDD method, as shown in FIG. 1 for example, a single channel (frequency) is divided into a transmission slot T and a reception slot R with respect to time, and such slots T and R are alternately repeated with a guard time Tg existent therebetween In an exemplary case, each of the transmission slots T and the reception slots R is 1 millisecond, and the guard time Tg is several ten microseconds. And a cordless telephone set (slave set) transmits a signal to a base station (master set) during the transmission slot T or receives a signal from the base station during the reception slot R.

In the TDD system which performs such transmission and reception, the transmitting and receiving circuits of the cordless telephone set are so constituted as shown in FIG. 2.

In this diagram, there are included a transmitting circuit 10, a receiving circuit 20, a system controller 31, and a clock generator 32. The system controller 31 serving to control the entire operation of the cordless telephone consists of a microcomputer. The clock generator 32 generates various timing clock signals and control signals The signals obtained from the system controller 31 and the clock generator 32 are supplied to unshown relevant circuits respectively.

In the transmitting circuit 10, a sound signal Sa is supplied to a transmission processor 11 which sequentially executes analog-to-digital (A-D) conversion, time base compression, addition of control data from the system controller 31, and division into two channels, so that digital data DI and DQ of I and Q channels are taken out every transmission slot T. Such data DI and DQ are supplied as modulating signals to an orthogonal modulator 12. Furthermore a carrier signal (oscillation signal) Si having a frequency fi of 80 MHz for example is outputted from an oscillator 13 every transmission slot T and then is supplied also to the modulator 12.

Thus, the orthogonal modulator 12 produces, during each transmission slot T, an intermediate frequency signal Sit (of intermediate frequency fi) modulated by the data DI and DQ.

The intermediate frequency signal Sit is supplied to a mixer 15, and a local oscillation signal Sc of a frequency fc is generated from a synthesizer oscillator 33 provided for selection of a transmission-reception channel. The signal Sc is supplied also to the mixer 15, while the signal Sit is frequency-converted into a transmission signal St of a frequency fs. In such frequency conversion, the following is executed.

$$fs = fi + fc$$

where fc = 2.6 GHz

The frequency fc or channel is set by controlling the synthesizer oscillator 33 by means of the system controller 31.

The transmission signal St is supplied to an antenna 35 via a signal line of a band pass filter 16→a power amplifier 17→a high-frequency switch 34, whereby the signal St is transmitted to the base station or master set.

In this stage, the switch 34 is selectively changed to a transmission slot T or a reception slot R in response to a control signal obtained from the clock generator 32, and the antenna 35 is selectively used for both the transmitting circuit 10 and the receiving circuit 20.

Meanwhile in the receiving circuit 20, the signal Sr (frequency fs) transmitted from the base station or master set during the reception slot R is received at the antenna 35. The signal Sr thus received is supplied to a first mixer 23 via a signal line of the switch 34→the band pass filter 21→the high-frequency amplifier 22, while a local oscillation signal Sc outputted from an oscillator 33 is supplied to the first mixer 23, so that the signal Sr is converted into a first intermediate frequency signal Sir. In this case, the intermediate frequency of the signal Sir is equal to the frequency fi of the signal Sit.

The signal Sir thus produced is supplied via a band pass filter 24 to a second mixer 25, and simultaneously a second local oscillation signal Sj from a second local oscillator 26 is supplied also to the mixer 25, whereby the signal Sir is converted to a second intermediate frequency signal Sjr (intermediate frequency fj = 450 kHz), which is then supplied via a band pass filter 27 to a demodulator 28 so as to be demodulated every reception slot R to become digital data DI and DQ. Thereafter such digital data DI and DQ are supplied to a reception processor 29 where a predetermined process for TDD reception is executed to regain the original sound signal Sb. Control data is also outputted from the processor 29 and is supplied to the system controller 31.

In the TDD type cordless telephone using a submicrowave band as mentioned above, there exists a problem with regard to the stability of the frequency. For example, the requisite frequency stability in transmission and reception is 1 ppm or so under the conditions including a line frequency fs of 2 GHz, π/4-shift QPSK modulation, a modulation speed of 80 kbps, delay detection for modulation, and a permissible C/N deterioration of 3 dB.

However, it is practically difficult to realize a quartz oscillator where the frequency stability is less than 1 ppm, and a considerable increase will be unavoidable in the production cost even if such oscillator can be realized.

Therefore an AFC function is a requisite for achieving a cordless telephone set which satisfies the above-described requirements in the submicrowave band.

However, in the TDD system where both the transmission signal St and the reception signal Sr have a burst waveform as shown also in FIG. 1, it is impossible to form an effective AFC circuit Suppose now that, in the cordless telephone set shown in FIG. 2, a carrier signal St is outputted from the oscillator 13 even during each reception slot R. In this state, due to the frequency of the carrier signal Si and the circuit configuration, the signal Si comes to leak out to the band pass filter 27 via the signal line of oscillator 13→modulator 12→mixer 15→mixer 23 band pass filter 24→mixer 25, thereby causing a signal S39 which is denoted by a broken line in FIG. 2. (Therefore, in the telephone set mentioned above, the carrier signal Si is outputted merely during each transmission slot T.)

The signal S39 thus caused is such as $$f39 = fi(1 + \alpha) - (fi - fj)(1 + \beta)$$
$$= fj(1 + \alpha)$$

where $\alpha$ is a precision of the oscillation frequency fi of the oscillator 13; $\beta$ is a precision of the oscillation frequency (fi−fj) of the oscillator 26; f39 is the frequency of the leakage signal S39 (frequency in the intermediate amplifier 27); and $\alpha = \beta$.

Accordingly the frequency error $\Delta f$ of the leakage signal S39 is expressed as $$\Delta f = \alpha f j$$

If fi=450 kHz and $\alpha$=5 ppm for example, $$\Delta f = 450 \times 10^3 \times 5 \times 10^{-6}$$
$$= 2.25 \text{ Hz}$$

The value of such error $\Delta f$ is sufficiently small to be ignorable in comparison with the transmission-reception frequency fs.

OBJECTS AND SUMMARY OF THE INVENTION

The present invention has been accomplished in view of the points mentioned. And its principal object resides in providing an improved transmitter-receiver which performs a satisfactory AFC function by converting the frequency of a leakage signal into a corresponding voltage and utilizing such voltage as a reference.

And another object of the present invention is to provide an improved AFC method for such a transmitter-receiver to execute an exact AFC action under any environmental conditions with frequency oscillation controlled in conformity with the reference voltage According to a first aspect of the present invention, there is provided a TDD type transmitter-receiver capable of dividing one channel into a transmission slot and a reception slot with respect to time and performing time-divided transmission and reception of data during such slots respectively. The transmitter-receiver comprises a signal line for receiving, when connected, a signal Sr modulated by a control signal 80 which includes a nonmodulating portion, and supplying a signal S39 from a modulator in a transmitting circuit to a receiving circuit; a frequency discriminator for converting the frequency of an intermediate frequency signal Sjr obtained from the receiving circuit into a corresponding voltage; and a memory circuit for storing the output voltage of the frequency discriminator. In this constitution, when the signal S39 from the modulator in the transmitting circuit is supplied via the signal line to the receiving circuit, the voltage outputted from the frequency discriminator is stored as a reference voltage in the memory circuit; and an automatic frequency control (AFC) operation is performed by controlling both the frequency of a carrier signal Si supplied to the modulator in the transmitting circuit and also the frequency of a local oscillation signal Sj supplied to the receiving circuit, in such a manner that the voltage outputted from the frequency discriminator during the time period of the nonmodulating portion becomes coincident with the stored reference voltage.

According to a second aspect of the present invention, there is provided a transmitter-receiver which comprises a signal line for supplying a signal S39 from a modulator in a transmitting circuit to a receiving circuit; a frequency discriminator for converting the frequency of an intermediate frequency signal Sjr obtained from the receiving circuit into a corresponding voltage; and a memory circuit for storing the output voltage of the frequency discriminator. In this constitution, when the signal S39 from the modulator in the transmitting circuit is supplied via the signal line to the receiving circuit, the voltage outputted from the frequency discriminator is stored as a reference voltage in the memory circuit, and an automatic frequency control operation is performed by controlling the frequency of a carrier signal supplied to the modulator in the transmitting circuit and also the frequency of a local oscillation signal supplied to the receiving circuit, in such a manner that the voltage outputted from the frequency discriminator during the period of the control signal becomes coincident with the stored reference voltage.

According to a third aspect of the present invention, there is provided an AFC method for such a transmitter-receiver comprising the steps of supplying a first nonmodulated carrier signal from a receiving circuit to a transmitting circuit; mixing the first nonmodulated carrier signal supplied to the receiving circuit with a local oscillation signal obtained from an oscillator, and converting the mixed signal into a first intermediate frequency signal; converting the frequency of the first intermediate frequency signal into a first output voltage; storing the first output voltage in a memory means; receiving by the receiving circuit a second nonmodulated carrier signal transmitted from a remote station; mixing the second nonmodulated carrier signal thus received with the local oscillation signal obtained from the oscillator, and converting the mixed signal into a second intermediate frequency signal; converting the frequency of the second intermediate frequency signal into a second output voltage; and controlling the oscillation frequency of the oscillator in such a manner that the second output voltage becomes coincident with the first output voltage.

The above and other features and advantages of the present invention will become apparent from the following description which will be given with reference to the illustrative accompanying drawings.

BRIEF DESCRIPTION OF THE DRAWINGS

FIG. 6A is a digram showing a control signal 80;

FIG. 6B is a diagram showing an expanded view of components of a control signal 80;

FIG. 6C is a diagram showing the "on-off" state of switch 733 relative to control signal 80;

FIG. 7A is a diagram showing a series of alternating transmission and reception time slots; and FIG. 7B is a timing diagram for explaining the invention.

DESCRIPTION OF THE PREFERRED EMBODIMENTS

First a description will be given on the constitution and the operation of an embodiment of FIG. 3 for transmitting an originating sound signal Sa and receiving a terminating sound signal Sb.

Figure 3:
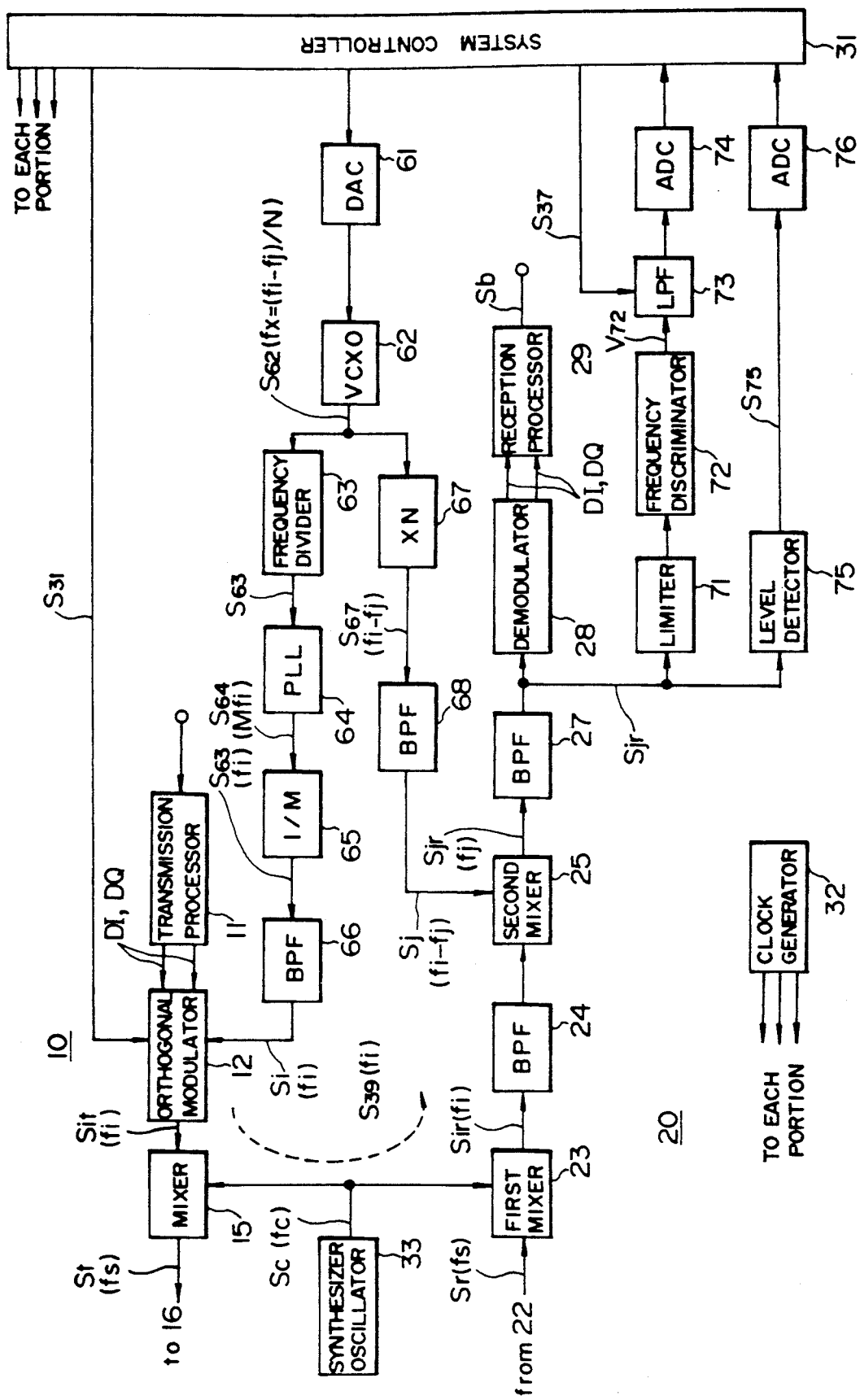
FIG. 3 is a partial block diagram of an exemplary embodiment of the present invention.

In FIG. 3, there is provided a variable frequency oscillator VCXO 62 equipped with a quartz oscillating element to generate an oscillation signal S62 of a frequency $fx=(fi-fj)/N$ (where N is an integer greater than 1).

The oscillation signal S62 is supplied to a frequency divider 63 to become a demultiplied signal S63 of a predetermined frequency, which is then supplied as a reference signal to a PLL circuit (frequency multiplier) 64. Subsequently the PLL circuit 64 produces an alternating signal S64 which is synchronized with the signal S63 and has a frequency Mfi (where M is an integer greater than 1 but is not equal to N). The signal S64 is supplied to a frequency divider 65 to become a demultiplied signal S65 of a frequency fi equivalent to 1/M. The signal S65 thus obtained is supplied to a band pass filter 66 where unrequired frequency components are removed, so that an alternating signal Si of the frequency fi alone is outputted therefrom. Then the signal Si is supplied as a carrier signal to a modulator 12.

When a power switch is turned on, the power is supplied to the entire circuits continuously with the exception that the operating voltage to the frequency divider 65 is supplied merely during the transmission slot T in principle.

Therefore, during the transmission slot T, the intermediate frequency signal (orthogonally modulated signal) Sit of the carrier frequency fi modulated by the data DI and DQ is outputted from the modulator 12 and then is frequency-converted to a transmission signal St of a predetermined channel by the oscillation signal Sc obtained from the oscillator 33 in the mixer 15. Thereafter the signal St thus produced is transmitted from an antenna 35.

The oscillation signal S62 from the VCXO 62 is supplied to a multiplier 67 which produces a signal S67 of an N-fold frequency $(fi-fj)$. The signal S67 is supplied to a band pass filter 68 where unrequired frequency components are removed, so that an alternating signal Sj of the frequency $(fi-fj)$ alone is obtained therefrom and then is supplied as a second local oscillation signal to the mixer 25.

Therefore, during the reception slot R, the first intermediate frequency signal Sir from the band pass filter 24 is converted to a second intermediate frequency signal Sjr of a frequency fj by the signal Sj obtained from the filter 68, and then the signal Sjr is supplied to a demodulator 28 so that the data DI and DQ are regained through demodulation.

Figure 1:
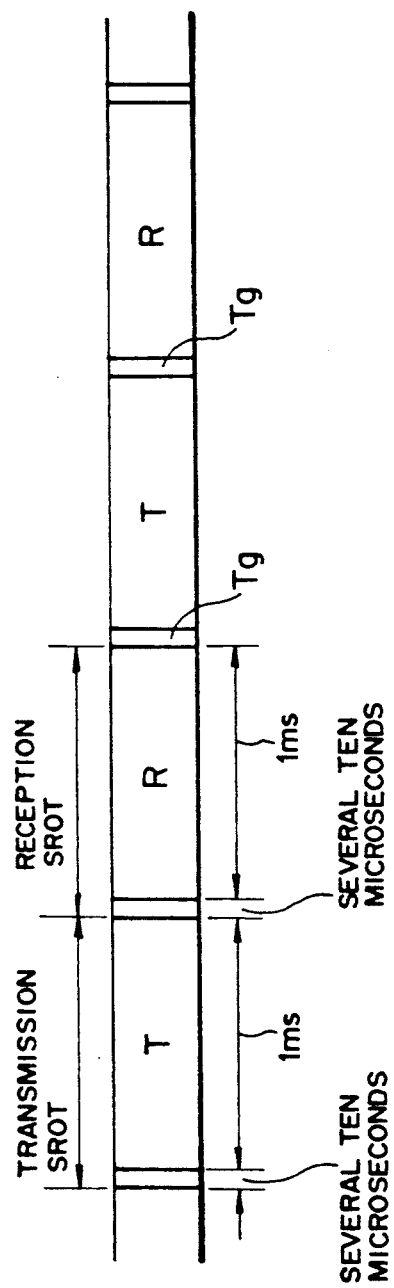
FIG. 1 schematically illustrates call slots for transmission and reception.
Figure 2:
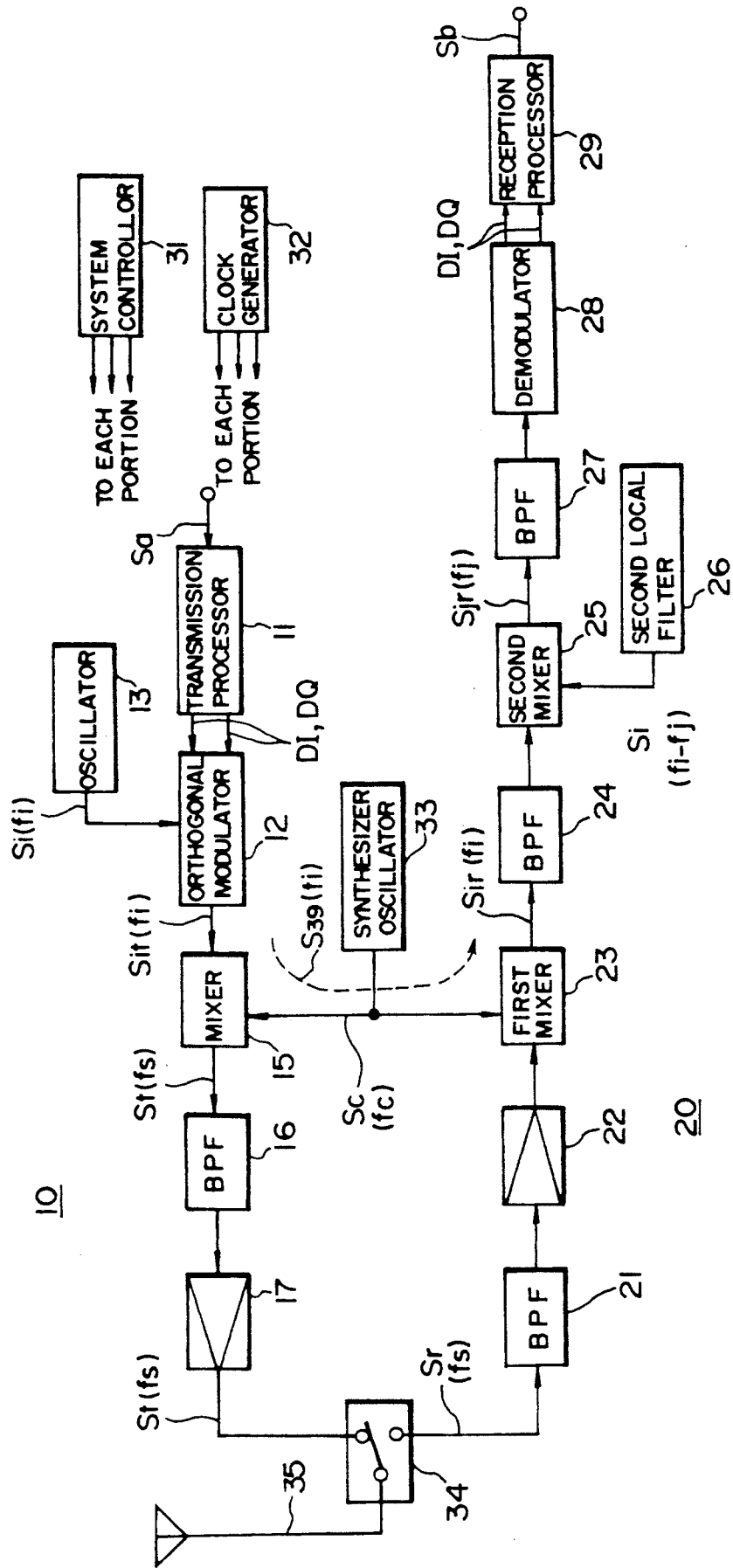
FIG. 2 is a block diagram of a conventional example.

During the reception slot R, no power is supplied in principle to the frequency divider 65, which is thereby kept out of operation to consequently produce none of the carrier signal during the reception slot R. Eventually the leakage signal S39 in FIG. 2 is not generated.

Further in this embodiment, the following constitution is contrived for realizing an AFC function.

A predetermined control signal is supplied from the system controller 31 to the modulator 12 and, when the power switch is turned on at the start of an originating call or the like, the intermediate frequency signal (orthogonally modulated signal) Sit from the modulator 12 is made to be a nonmodulated carrier signal.

Control data for the VCXO 62 is outputted from the system controller 31 and is converted into an analog voltage by a D-A converter 61. And then such control data is supplied as a control voltage to the VCXO 62.

Furthermore the signal Sjr from the band pass filter 27 is supplied via a limiter 71 to a frequency discriminator 72, from which a DC voltage V72 of a level corresponding to the frequency of the signal Str is outputted and then is supplied via a low pass filter 73 to an A-D converter 74. The voltage V72 is converted into a digital signal and then is supplied to the system controller 31.

Figure 4:
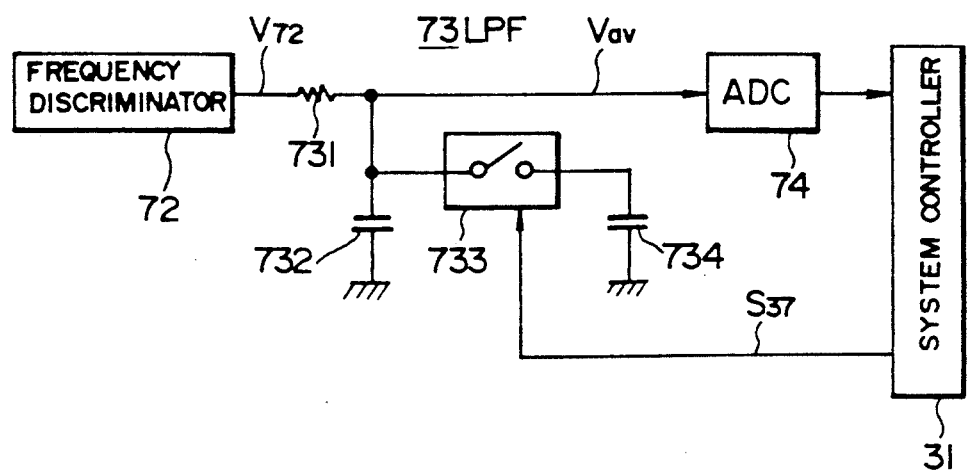
FIG. 4 is a partial circuit diagram of the embodiment of the invention.

In this embodiment, the low pass filter 73 is so formed that its time constant is variable. More specifically, as shown in FIG. 4, the low pass filter 73 consists of a resistor 731 and a capacitor 732, and a series circuit of a switch 733 and a capacitor 734 is connected in parallel to the capacitor 731. The capacitor 734 has a predetermined capacitance greater than that of the capacitor 733. As will be described later, the switch 733 is selectively turned on or off by the control signal S37 outputted from the system controller 31.

The signal Sjr from the band pass filter 27 is supplied to a level detector 75, which produces a signal S75 indicating the level of the intermediate frequency signal Sij, i.e., the level of the reception signal Sr. Such signal S75 is supplied via an A-D converter 76 to the system controller 31.

When the power switch is turned on, an unshown power source for the transmitting circuit 10 is controlled by the system controller 31, so that the frequency divider 65 is continuously energized inclusive of the reception slot R, whereby the carrier signal Si is supplied continuously to the modulator 12. Then the operation of the modulator 12 is inhibited by the control signal from the system controller 31, whereby a nonmodulated intermediate frequency signal (carrier signal) Sit is outputted continuously from the modulator 12. The circuits from the mixer 23 up to the band pass filter 27 are energized continuously, including the duration of the transmission slot T.

Therefore, as described with regard to FIG. 2, the intermediate frequency signal Sit from the modulator 12 comes to leak out to the mixer 23 via the line of modulator 12→mixer 15→mixer 23→band pass filter 24→mixer 25, so that the leakage signal S39 is sequentially converted to intermediate frequency signals Sir and Sjr by the mixers 23 and 25 respectively.

The signal Sjr from the band pass filter 27 is supplied via the limiter 71 to the frequency discriminator 72, which then produces a DC voltage V72 of a level corresponding to the frequency of the signal Sjr. The voltage V72 thus obtained is supplied to the system controller 31 by way of the low pass filter 73 and the A-D converter 74. In this stage, the switch 733 for the low pass filter 73 is held in its off-state. The detection signal S75 representing the level of the received signal and outputted from the detector 75 via the A-D converter 76 is checked in the system controller 31, and when the intermediate frequency signal Sjr converted from the leakage signal S39 of a predetermined level is obtained, the voltage V72 being supplied to the system controller 31 at that instant is stored as a reference voltage Vrf in the system controller 31.

Thus, when the power supply is switched on, the intermediate frequency signal Sjr converted from the leakage signal S39 is stored as a reference voltage Vrf in the system controller 31. In this case, a carrier signal Si is formed in accordance with the frequency-divided signal S63 of the oscillation signal S68 outputted from the VCXO 62, and a local oscillation signal Sj is formed by frequency-multiplying the signal S62, whereby the frequency precision $\alpha$ of the signal Si and the frequency precision $\beta$ of the signal Sj are equalized to each other so that, when evaluated as a converted frequency, the error of the reference voltage Vrf stored in the system controller 31 is sufficiently small to be ignorable in comparison with the transmission-reception frequency fs as mentioned.

In the case of a home cordless slave telephone set or the like having no control channel through which a control signal is continuously transmitted, the switch 733 in FIG. 4 is turned off in response to storage of the reference voltage Vrf, and then an originating-call request signal (connection request signal) is transmitted to the master set through a control channel. And upon reception of the originating-call request signal by the master set, an originating-call answer signal is transmitted from the master set through a call channel. Each of such originating-call request signal and answer signal is formed to be a control signal 80 which includes a nonmodulating portion 81 as shown in FIG. 5.

Figure 5:
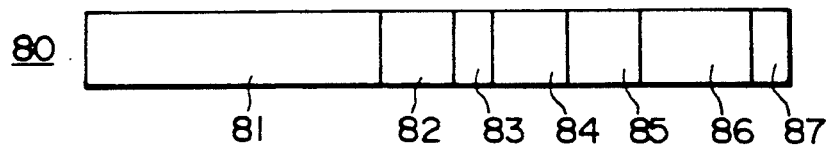
FIG. 5 is a schematic diagram for explaining the invention.

FIG. 5 is a diagram schematically showing the format of the control signal 80 transferred between a master set and a slave set (cordless telephone set) when such two sets are connected to each other, i.e., when an originating call or a terminating call is requested.

The control signal 80 has, at its top, a signal portion 81 for not modulating the signals Sr and St, and also has a preamble signal 82, a sync bit 83, a local identification code 84, a remote identification code 85, control bits 86 and an error detection bit 87 in this order. Therefore, when the signal Sr or St is modulated by the control signal 80, the portion of the signal Sr or St corresponding to the aforementioned signal portion 81 becomes a nonmodulated carrier signal. The control bits 86 hold the information required between the master set and the slave set.

When the transmission signal Sr for the control signal 80 from the master set has been received by the cordless telephone set of FIG. 3, the arrival of such transmission signal Sr is discerned by the system controller 31 on the basis of the detection signal S75 obtained from the detector 75, and the output voltage V72 of the frequency discriminator 72 in the duration of the carrier nonmodulating portion 81 of the control signal 80 is inputted to the system controller 31.

Meanwhile, in the case of a slave set (local station) of a public cordless telephone system where a control channel for transmission of a control signal is provided in addition to an ordinary communication or call channel, an AFC action is executed upon storage of the reference voltage Vrf by using a control signal received from the base station. The base station of the public cordless telephone system transmits, through the control channel, a control signal 80 periodically for a fixed duration $T_{SF}$ termed "superframe", as shown in FIG. 6A. The control signal 80 is transmitted through the channel common to the entire zone of the base station, and the duration $T_{SF}$ is the same throughout the zone. As shown in FIG. 6B, the control signal 80 includes a preamble signal 81 at its top, and successively a sync signal 82, control bits 83 and an error detection bit 84 in this order. The control bits 83 hold the identification code of the base station and the information required for each cordless telephone set (slave set).

In response to the control signal 80 received per superframe $T_{SP}$, the cordless telephone set of FIG. 3 selects one base station of the received maximum-level signal Sr in accordance with the detection signal S75 obtained from the detector 75 and, as shown in FIG. 6C, the switch 733 in FIG. 4 is turned on by the control signal S37 every duration of the control signal 80 for duration of the preamble 81), so that a voltage Vav produced by smoothening the voltage V72, i.e., an average voltage Vav of the voltage V72 obtained by frequency-discriminating the control signal 80, is held in the capacitor 734.

In this case, if there exists any difference between the output voltage V72 or the average voltage Vav and the reference voltage Vrf stored in the system controller 31, such difference is based on the deviation of the frequency fj of the second intermediate frequency signal from the reference value (=450 kHz), and the deviation of the second intermediate frequency fj is derived from the deviation of the frequency fc of the local oscillation signal Sc. Namely, the difference voltage Vdi between the output voltage V72 or the average voltage Vav and the reference voltage Vrf signifies the deviation of the frequency fc of the local oscillation signal Sc.

The output voltage V72 or the average voltage Vav is supplied via the A-D converter 74 to the system controller 31, which then produces data to indicate the difference voltage Vdi between the output voltage V72 and the reference voltage Vrf. Such data is converted into an analog voltage by the D-A converter 61 and then is supplied as a control voltage to the VCXO 62, so that the oscillation frequency fx of the signal S62 is controlled in the direction to reduce the difference Vdi to zero, whereby the frequency fj of the second intermediate frequency signal Sjr is finally converged to the reference value. In this stage, if the oscillation frequency fx of the VCXO 62 is varied to cause a change in the frequency of the second local oscillation signal Sj, the frequency of the carrier signal Si is also changed substantially by the same amount, so that the deviation of the oscillation frequency fc of the oscillator 33 is substantially canceled by the change in the frequency of the carrier signal Si, whereby the AFC action is completed.

And subsequently the TDD process for an originating call or a terminating call is executed.

There may occur a frequency drift during a call to consequently deteriorate the speech quality. Therefore the AFC action is performed also during each call. FIG. 7A is a simplified diagram of call slots shown in FIG. 5. As illustrated in FIGS. 7A and 7B, the receiving circuit 20, particularly the line from the mixer 23 to the band pass filter 27 therein, is placed in an operating state during each transmission slot T in a time period Tc. And the switch 733 for the low pass filter 73 is turned on during each transmission slot T in the time period Tc by the control signal S37 obtained from the system controller 31, so that the output voltage V72 of the frequency discriminator 72 is smoothened or averaged by the capacitor 734, and then the average voltage Vav thus obtained is stored as a reference voltage Vrf in the system controller 31 as mentioned above.

The switch 733 for the low pass filter 73 is turned on during each reception slot R in a time period Td by the control signal S37 obtained from the system controller 31, so that the output voltage V72 delivered from the frequency discriminator 72 is smoothened or averaged by the capacitor 734 to become an average voltage Vav, which is then supplied to the system controller 31 to be compared with the reference voltage Vrf stored during the time period Tc, whereby a difference voltage therebetween is obtained. And the oscillation frequency of the VCXO 62 is controlled in such a manner as to reduce the difference voltage Vdi to zero.

It follows that the AFC action is performed even during the call by cyclically executing the process in the time periods Tc and Td.

In the above procedure, the master set or base station performs the same operation as that of the slave set (local station). In the case of a terminating call, the reference voltage Vrf is stored in the master set or base station in response to a ringer signal, and the mutual situation is reversed in the master set or base station and the slave set (local station). The nonmodulated carrier signal Sit can be produced by supplying, instead of the aforementioned data DI and DQ, fixed-level data to the modulator 12. It is further possible to set the frequency of the second local oscillation signal Sj to (fi+fj) by determining the frequency relation as fx =(fi+fj)/N.

In describing the above embodiment, the AFC actions for the home and public cordless telephone systems have been explained individually. However, it is rendered possible to use the terminal (slave) set and the AFC circuit for both home and public telephone systems by controlling the system controller 31.

As described hereinabove, in the TDD type digital cordless telephone system using a submicrowave band, the present invention is so contrived that a leakage signal S39 outputted from the modulator 12 is converted to an intermediate frequency signal Sjr, and a voltage obtained by frequency-converting the signal Sjr is used as a reference voltage Vrf. And the oscillation frequency fx of the VCXO 62 for producing a carrier signal Si and a second local oscillation signal Sj is controlled in such a manner that the voltage V72, which is obtained by frequency-discriminating the intermediate frequency signal Sjr during the time period of the carrier nonmodulating signal 81 included in the originating-call request signal or during the time period of the control signal received through the control channel, becomes coincident with the reference voltage Vrf, whereby the AFC action can be properly performed.

Furthermore, it is possible to execute the AFC action even during a call with correction of the reference voltage Vrf, hence preventing deterioration of the speech quality that may otherwise be caused by any frequency drift during the call. In addition, there is attainable another advantage that eliminates the necessity of a high-precision quartz oscillator where the frequency stability is less than 1 ppm, thereby averting a wide increase of the production cost.

What is claimed is:

1. A TDD type transmitter-receiver capable of dividing one channel into a transmission slot and a reception slot with respect to time and performing time-divided transmission and reception of data during such slots respectively, said transmitter-receiver comprising:
   a transmitting circuit having a means for generating a carrier signal;
   a receiving circuit capable of receiving signals from a remote transmitter;
   said receiving circuit comprising an oscillation means to generate and oscillation signal;
   said oscillation means comprises an oscillator,
   a signal line for supplying said carrier signal from said transmitting circuit to said receiving circuit;
   a mixer to mix during a reception slot a received signal or, during said transmission slot, said carrier signal with said oscillation signal to produce an intermediate frequency signal;
   a frequency discriminator for generating a voltage in accordance with the frequency of said intermediate frequency signal;
   means for storing the value of said voltage generated during said transmission slot; and
   means for controlling, during said reception slot, the oscillation frequency of said oscillator in accordance with said stored voltage value.

2. The transmitter-receiver according to claim 1, further comprising a means for detecting the level of said carrier signal received from said transmitting circuit.

3. The transmitter-receiver according to claim 1, wherein said transmitting circuit includes a means for frequency-dividing said oscillation signal to generate said carrier signal.

4. The transmitter-receiver according to claim 1, wherein said signal line further comprises a first mixer for converting said intermediate frequency signal into a transmission signal of a predetermined frequency; a second mixer for converting a received signal from a remote transceiver of said predetermined frequency into a signal of an intermediate frequency; and a synthesizer oscillator for supplying a predetermined local oscillation signal to said first and second mixers.

5. The transmitter-receiver according to claim 1, wherein said frequency discriminator further comprises averaging means for outputting an averaged voltage for a predetermined period of time in accordance with the frequency of said intermediate frequency signal.

6. The transmitter-receiver according to claim 5, wherein said averaging means comprises a resistor connected in series with a first capacitor, and a second capacitor switchably connected in parallel with said first capacitor, said second capacitor having a greater value of capacitance than said first capacitor.

7. An automatic frequency control method for use in a TDD type transmitter-receiver having an oscillator, which is capable of dividing one channel into a transmission slot and a reception slot with respect to time and performing time-divided transmission and reception of data during such slots respectively, said method comprising the steps of:
   supplying a first nonmodulated carrier signal from a transmitting circuit to a circuit during a transmission time slot;
   mixing said first nonmodulated carrier signal supplied to said receiving circuit with a local oscillation signal obtained from an oscillator, and converting the mixed signal into a first intermediate frequency signal;
   converting the frequency of said first intermediate frequency signal into a first output voltage;
   storing a representation of the value of said first output voltage in a memory means;
   receiving by said receiving circuit, during a reception time slot, a second nonmodulated carrier signal transmitted from a remote station;

mixing said second nonmodulated carrier signal received with a local oscillation signal obtained from said oscillator, and converting the mixed signal into a second intermediate frequency signal;

converting the frequency of said second intermediate frequency signal into a second output voltage; and controlling the oscillation frequency of said oscillator in such a manner that the level of said second output voltage becomes coincident with the value of said first output voltage stored in said memory means.

8. An automatic frequency control method according to claim 7, wherein said second nonmodulated carrier signal is included in an originating-call request signal or an originating-call answer signal.

9. An automatic frequency control method for use in a TDD type transmitter-receiver which is capable of dividing one channel into a transmission slot and a reception slot with respect to time and performing time-divided transmission and reception of data during such slots respectively, said method comprising the steps of:

supplying a first nonmodulated carrier signal from a transmitting circuit to a receiving circuit during a transmission time slot;

mixing said first nonmodulated carrier signal supplied to said receiving circuit with a local oscillation signal obtained from an oscillator, and converting the mixed signal into a first intermediate frequency signal;

converting the frequency of said first intermediate frequency signal into a first output voltage;

storing the value of said first output voltage in a memory means;

receiving a control signal from a remote transmitter by said receiving circuit during a reception slot;

mixing said received control signal with said local oscillation signal obtained from said oscillator to produce a second intermediate frequency signal;

converting the frequency of said second intermediate frequency signal into a second output voltage; and controlling the oscillation frequency of said oscillator so that the value of said second output voltage becomes coincident with the value of said first output voltage stored in said memory means.

10. The automatic frequency control method according to claim 9, wherein said stop of converting the frequency of said second intermediate frequency signal into a second output voltage further comprises the step of averaging said second output voltage.

11. An automatic frequency control method for a TDD type transmitter-receiver capable of dividing one channel into a transmission slot and a reception slot with respect to time and performing time-divided transmission and reception of data during such slots respectively, said method comprising the steps of:

supplying a carrier signal from a transmitting circuit of a receiver to a receiving circuit of said transceiver for a predetermined period of time;

mixing said carrier signal supplied to said receiving circuit with a local oscillation signal generated by an oscillation means, and converting the resulting signal into a first intermediate frequency signal;

converting the frequency of said first intermediate frequency signal into a first output voltage;

storing a representation of the value of said first output voltage in a memory means;

receiving, by said receiving circuit, for a predetermined period of time, a second carrier signal from a remote transmitter;

mixing said second carrier signal with said local oscillation signal and converting the mixed signal into a second intermediate frequency signal;

converting the frequency of said second intermediate frequency signal into a second output voltage; and controlling the oscillation frequency of said oscillation means in such a manner that the value of said second output voltage becomes coincident with the value of said first output voltage stored in said memory means.

12. The automatic frequency control method according to claim 11, further comprising the step of averaging said first output voltage.

13. A TDD type transceiver capable of dividing one channel into a transmission slot and a reception slot with respect to time and performing time-divided transmission and reception of data during such slots respectively, said transceiver comprising:

a transmitting circuit for transmitting signals to a remote receiver;

said transmitting circuit comprising means for generating a nonmodulated carrier signal;

a receiving circuit for receiving signals from a remote transmitter;

a signal path for allowing said carrier signal to pass from said transmitting circuit to said receiving circuit during a transmission slot;

said receiving circuit further comprising:

an oscillation means for generating an oscillation signal;

a mixer for mixing said oscillation signal with said nonmodulated carrier signal to produce an intermediate frequency signal;

a frequency discriminator for generating a voltage in accordance with the frequency of said intermediate frequency signal;

means for storing the value of said voltage; and means for controlling, during a receiving slot, the oscillation of aid oscillation means in accordance with said stored voltage value.

14. A TDD type transmitter-receiver capable of dividing one channel into a transmission slot and a reception slot with respect to time and performing time-divided transmission and reception data during such slots respectively, said transmitter-receiver comprising:

a transmitting circuit for transmitting signals to a remote receiver, said transmitting circuit comprising means for generating a carrier signal;

a receiving circuit for receiving signals from a remote transmitter, a signal path for allowing said carrier signal to pass from said transmitting circuit to said receiving circuit during a transmission slot;

said receiving circuit further comprising:

an oscillation means for generating an oscillation signal;

said oscillation means comprising an oscillator;

a mixer for mixing said oscillation signal with said carrier signal to produce an intermediate frequency signal;

a frequency discriminator for generating a voltage in accordance with the frequency of said intermediate frequency signal;

means of storing the value of said voltage; and means for controlling, during a receiving slot, the oscillation frequency of said oscillator in accordance with said stored voltage value.

15. A TDD type transmitter-receiver according to claim 14 wherein said means for generating a carrier signal comprises said oscillation means for generating an oscillation signal.

16. A TDD type transmitter-receiver according to claim 14 wherein said carrier signal is non-modulated.

17. A TDD type transmitter-receiver according to claim 14 wherein said transmitting circuit further comprises means for frequency dividing said oscillation signal to generate said carrier signal.

18. A TDD type transmitter-receiver according to claim 14 wherein said signal path further comprises:
   a transmitter mixer for converting an intermediate frequency signal into a transmission signal;
   a receiver mixer for converting a received signal of a predetermined intermediate frequency into a reception signal of an intermediate frequency; and
   a synthesizer oscillator for supplying a predetermined local oscillation signal to said transmitting and receiver mixers.

19. A TDD type transmitter-receiver capable of dividing one channel into a transmission slot and a reception slot with respect to time and performing time-divided transmission and reception of data during such slots respectively, said transmitter-receiver comprising:
   transmitting circuit for transmitting signals to a remote receiver,
   said transmitting circuit comprising means for generating a carrier signal;
   a receiving circuit for receiving signals from a remote transmitter,
   a signal path for allowing said carrier signal to pass from said transmitting circuit to said receiving circuit during a transmission slot;
   said receiving circuit further comprising:
   an oscillation means for generating an oscillation signal at an oscillation frequency;
   a mixer for mixing said oscillation signal with said carrier signal to produce an intermediate frequency signal;
   a frequency discriminator for generating a voltage in accordance with the frequency of said intermediate frequency signal;
   means for storing a value of said voltage;
   means for controlling, during a receiving slot, the oscillation frequency of said oscillation means in accordance with said stored voltage value;
   said oscillation means comprises an oscillator; and
   said means for generating a carrier signal further comprises said oscillator.

* * * * *